United States Patent [19]

Horowitz et al.

[11] 3,916,073

[45] Oct. 28, 1975

[54] PROCESS FOR PASSIVATING SEMICONDUCTOR SURFACES AND PRODUCTS THEREOF

[75] Inventors: Carl Horowitz; Michael Dichter, both of Brooklyn, N.Y.

[73] Assignee: General Instrument Corporation, Clifton, N.J.

[22] Filed: Mar. 11, 1974

[21] Appl. No.: 449,955

[52] U.S. Cl. ................ 428/451; 428/500; 428/524; 428/538; 427/82; 427/385; 427/122; 357/8; 357/52

[51] Int. Cl.² .................... H01L 29/34; B32B 13/12

[58] Field of Search ...... 117/201, 226, 136; 357/72, 357/161 K, 52, 8

[56] References Cited

UNITED STATES PATENTS

| | | | |
|---|---|---|---|
| 2,949,640 | 8/1960 | Collins | 117/161 K |
| 3,179,614 | 4/1965 | Edwards | 260/30.2 |
| 3,615,913 | 10/1971 | Shaw | 117/201 |
| 3,684,592 | 8/1972 | Chang | 117/201 |
| 3,804,669 | 4/1974 | Bockstie | 117/218 |
| 3,822,327 | 7/1974 | Weil | 260/928 |

FOREIGN PATENTS OR APPLICATIONS

| | | | |
|---|---|---|---|
| 863,738 | 3/1961 | United Kingdom | 117/136 |

*Primary Examiner*—Michael F. Esposito

[57] ABSTRACT

Polymerizable coatings containing electrically active (electrophilic or nucleophilic) monomers are grafted onto the surface of a semiconductor device, by transesterification and/or hydroperoxide addition, to passivate the surface and improve the electrical characteristics of the semiconductor device. The polymerizable coating for n-type semiconductors contains at least one electrophilic monomer such as an electrophilic polyallyl ester (e.g. diallyl phthalate), and the polymerizable coating for p-type semiconductors contains at least one nucleophilic monomer such as a nucleophilic nitrogen-containing vinyl ester (e.g. polyallyl cyanidine) and preferably a mixture of such nucleophilic and electrophilic monomers. Various optional ingredients of the polymerizable coatings include polyfunctional vinyl phosphorus monomers to impart flame-resistance (for the n-type coatings only), a vinyl aromatic monomer to permit low temperature curing of the coating and enhanced rigidity thereof, carbon black to impart opacity and light stability, solvents, fillers, free radical polymerization initiators, and polymerization inhibitors.

57 Claims, No Drawings

PROCESS FOR PASSIVATING SEMICONDUCTOR SURFACES AND PRODUCTS THEREOF

BACKGROUND OF THE INVENTION

It has long been known in the semiconductor art that one of the factors which prevents semiconductor devices from realizing their predicted performance is electrical surface charge. This charge may be in states which are present at the surface of the single crystal itself or may possibly represent ions on the outside of the naturally occurring surface oxide layer.

Surface charges of either sign tend to attract mobile carriers (that is, holes or electrons) of the opposite sign and thereby alter the carrier density in a thin region beneath the surface of the semicondcutor crystal. If the induced carriers are of the same sign as those in the bulk of the crystal a so-called accumulation layer is created which acts as a surface skin of low resistivity. If, on the other hand, the induced carriers are of the opposite sign to those in the bulk, either a surface region depleted of carriers or a so-called inversion layer is created; although the inversion layer is of opposite conductivity type than the bulk, it also tends to act as a surface layer of low resistivity.

In general these low resistance surface layers -- the accumulation layer and the inversion layer -- are responsible for the leakage current of semiconductor P-N junction diodes. In a typical asymmetrically doped diode in which the depletion region is nearly all on one side of the junction, it is commonly thought that the low resistance surface layer over the depleted semiconductor causes large leakage currents at voltages well below the breakdown voltage of the diode. In such a case the low resistance surface layer is called a "channel". Especially when the diode is being operated as a bistable or off-on switch and desirably has only non-flow and full-flow current states, such premature current leakages through the channel at gate voltages below the "avalanche" or "breakdown" voltage which produces full-flow current are undesirable. In such devices it is desirable that there be no current flow until a high gate voltage is applied, and that the maximum current possible be produced as soon as the high gate voltage is applied. Such devices are often graded according to the gate or breakdown voltage at which avalanche occurs (the higher, the better) and according to the sharpness of the transition from no current to avalanche current (the transition point commonly being referred to as a "knee," with "sharp" or right-angle knees being preferred over "soft" knees).

Variations in the amount of surface charge have in some cases been partially reduced by etching of the semiconductor surface to remove impurities therefrom and then intentionally applying an electrically neutral passivating layer to the outer surface to protect it from impurities found in the environment. For example, coatings of silicon dioxide, silicon nitride, glass, epoxy resins and the like have been applied to the surfaces of semiconductor devices to protect such surfaces from environmental impurities such as moisture and dirt which tend otherwise to accumulate on the semiconductive surface and impair the electrical characteristics of the device. The electrically neutral materials are typically applied to the semiconductor surface to be passivated in the form of a plasticized solution from which the solvent is later evaporated.

Such passivating coatings have not been found to be entirely satisfactory in use for a number of reasons. Such coatings tend to contain minute pinholes which permit moisture to attack the semiconductor surface. Even when the coating is initially imperforate, the coatings typically display low resistance to cracking (due to stress or temperature fluctuations) and a poor adhesion to the semiconductor surface.

As the known semiconductor devices tend to be photosensitive, especially to infrared radiation, a desirable coating must not only be itself light-stable, if it is to be exposed to light, but also sufficiently opaque to isolate the semiconductor material from ambient light. In certain applications where the environment may contain acid fumes, the coating should desirably also be etch-resistance in order to maintain the integrity of the coating and so afford continuing protection to the semiconductor device. Where arcing in the general vicinity of the semicondcutor device is likely, the coating should desirably also be heat-stable and non-flammable --that is, stable at elevated temperatures and incapable of supporting combustion (self-extinguishing). Especially when a thick coating is being used, the material of which the coating is fabricated should furthermore be relatively inexpensive, of suitable viscosity and homogeneity as to be easily moldable and workable, and rapidly curable at low temperatures to minimize exposure of the semiconductor devices to adverse conditions. While the known coatings may provide one or more of these functions, none have been found to perform all or even most of these functions in a totally satisfactory fashion.

Accordingly, it is an object of the present invention to provide a process for the grafting of a passivating coating onto the surface of a semiconductor device to improve the electrical characteristics of the device.

It is also an object to provide such a process in which the grafted coating increases the breakdown voltage and sharpness of the knee characteristic of the semiconductive device, while exhibiting excellent adherence to the surface, high thermal stability and a resistance to cracking.

It is another object to provide such a process in which the coating is moisture-resistant, heat-resistant, non-flammable, opaque, light-stable, etch-resistant, or a combination thereof as desired.

Another object is to provide such a process in which the uncured coating composition is inexpensive, homogeneous, easily moldable and workable, and curable rapidly at low temperatures.

A further object is to provide a semiconductor device having a surface passivated with a coating according to the aforementioned process.

SUMMARY OF THE INVENTION

It has now been found that the above and related objects of the present invention are obtained by intimately grafting electrically active monomers to the semiconductor surface to preclude (or neutralize) the formation of low resistance accumulation and inversion layers thereon. The process comprises the steps of applying a polymerizable coating containing at least one electrically active monomer (i.e., an electrophilic or nucleophilic monomer) to the surface of a semiconductor device to be passivated, and polymerizing and curing the polymerizable coating to effect grafting of the electrically active monomer onto the surface and cure of the coating, whereby the cured coating passivates the surface and improves the electrical characteristics of the semiconductor device. Polymerization and curing are preferably achieved by maintaining the polymerizable coating at a temperature of about 80° to 200°C for a period of time sufficient to effect grafting (through transesterification and/or hydroperoxide addition) of the electrically active monomer to the semiconductor surface and cure of the coating. The polymerizable coating for an n-type semiconductor contains at least one electrophilic monomer such as an electrophilic polyallyl ester, while the polymerizable coating for a p-type semiconductor contains at least one nucleophilic monomer such as a nucleophilic nitrogen-containing vinyl ester, and preferably a mixture of such nucleophilic and electrophilic monomers.

More specifically, the electrophilic monomer used in the polymerizable coating to improve the electrical characteristics of the semiconductor device is a polyallyl ester such as a diallyl ester selected from the group consisting of aliphatic, aromatic, and homocyclic compounds and mixtures thereof. It is preferably a diallyl phthalate and generally comprises at least 50 percent by weight of the polymerizable coating (absent any filler). The nucleophilic monomer used for the same purpose is a nitrogen-containing vinyl ester such as a polyallyl cyanidine. It is preferably selected from the group consisting of triallyl cyanurate, allyl imidazole, vinyl carbazole, diallyl melamine, and mixtures thereof, and generally comprises 10–25 percent by weight of the polymerizable coating (absent any filler).

A variety of optional ingredients may be added to the polymerizable coating to provide specific desired features. For example, the addition to the polymerizable coating of 0.5–1.5 percent carbon black renders the coating substantially opaque and light-stable, 10–40 percent vinyl aromatic monomer facilitates low temperature curing of the coating and imparts enhanced rigidity thereto, and 15–25 percent polyfunctional vinyl phosphorus monomer imparts flame-resistance to the n-type coating (based on the weight of the coating absent filler); solvents, fillers, free radical polymerization initiators and polymerization inhibitors may also be added advantageously.

DETAILED DESCRIPTION OF THE PREFERRED EMBODIMENTS

The conventional semiconductor devices to be coated according to the process of the present invention may be any of the common n-type, p-type, or combination types, and may vary from a single thin wafer-like diode to a relatively long stack of many chips wired in series and braised together with conventional materials such as aluminum.

The nature and location of the semiconductor surface to be passivated may vary with the type of semiconductor and according to its classification as a junction, field effect, or other type of semiconductor, as is well known to those skilled in the art. Typically such surfaces are composed at least in part of silicon, germanium, the Group III-Group V compounds such as gallium phosphide and gallium arsenide, and various oxides, hydroxides and combinations thereof. Depending on the type of semiconductive device to be coated, the impurities or dopants (such as phosphorus, arsenic, boron and the like) may or may not be present on the surface to be passivated, and various conductive leads of aluminum or like metals may or may not be attached to the particular surface to be coated. The current semiconductor devices generally utilize as a base material silicon, its oxides, hydroxides and combinations thereof. The composition of the surface to be passivated will be further discussed hereinafter in connection with the explanation of the proposed reaction mechanism by which the coating is grafted onto the semiconductor surface.

THE ELECTRICALLY ACTIVE MONOMERS

A semiconductor device according to the present invention has a cured coating characterized by the presence of at least one electrically active monomer grafted onto the semiconductor surface-- that is, at least one nucleophilic (positive charge attracting) or electrophilic (negative charge attracting) monomer. The cured coating for a n-type semiconductor device is characterized by the presence of a grafted electrophilic monomer, while the coating of a p-type semiconductor is characterized by the presence of a grafted nucleophilic monomer, and preferably a mixture of grafted electrophilic and nucleophilic monomers.

The electrophilic monomers useful in the present invention are generally electrophilic polyallyl esters, preferably electrophilic diallyl esters selected from the group consisting of aliphatic, aromatic, and homocyclic compounds and mixtures thereof. The electrophilic diallyl ester generally constitutes at least 50 percent of the polymerizable coating, and preferably at least 60 percent by weight (based on the coating without filler).

Where the ability of the coating to withstand elevated temperatures is critical, the electrophilic diallyl ester is preferably an aromatic ester such as diallyl phthalate, di-ortho-diallyl phthalate and mixtures of di-ortho- and di-meta-diallyl phthalate being preferred. Where high temperature resistance is less important, the electrophilic diallyl esters may be homocyclic compounds such a tetrahydro diallyl phthalate (DATHP) or aliphatic compounds such as diallyl sebacate and diallyl adipate (DAA), or mixtures thereof. The aromatic diallyl esters withstand temperatures as high as 250°C without appreciable formation of hydrogen gas, while the aliphatic diallyl esters shows gas evolution at temperatures as low as 150°C. (Unless otherwise specified, the diallyl phthalate utilized herein is the di-ortho-diallyl phthalate --commonly called diallyl isopthalate (DAIP). However, the di-para-diallyl phthalate --commonly called diallyl terephthalate (DATP)-- and the di-meta diallyl phthalate (DAMP) are also useful in the practice of the present invention.) The diallyl phthalates are also preferred electrophilic diallyl esters where resistance to common etchants such as nitric and hydrofluoric acids is desired.

The nucleophilic monomers useful in the present invention are generally nucleophilic nitrogen-containing vinyl esters, preferably nucleophilic heterocyclic ring-nitrogen containing vinyl esters such as triallyl cyanurate, allyl imidazole, vinyl carbazole, diallyl melamine and mixtures thereof. The preferred nucleophilic vinyl esters are the cyanidines, and especially the polyallyl cyanidines. The use of nucleophilic vinyl esters containing a ring-nitrogen produces good electronic properties at both high and low temperatures, while the use of nucleophilic vinyl esters containing only a non-ring nitrogen (such as dimethylaminoethyl methacrylate) produces good electronic properties only at low temperatures.

The polymerizable coating for a p-type semiconductor will generally include about 10–25 percent of nucleophilic monomer, and preferably 15–20 percent by weight (based on the coating without filler). While coatings wherein the only active monomers are nucleophilic monomers provide the expected enhancement of the electrical characteristics, it has been found that such coatings tend to be somewhat rigid and subject to cracking. Accordingly, it is preferred that the polymerizable coating for a p-type semiconductor actually contains both the same amount of nucleophilic monomer and a quantity of the electrophilic monomer heretofore described in connection with the polymerizable coatings for n-type semiconductors. Such preferred p-type polymerizable coatings containing both electrophilic and nucleophilic monomers generally include at least 50 percent of the "active" monomers, and preferably at least 60 percent by weight (based on the coating without filler), with about 10–25 percent of the coatings being comprised of the nucleophilic monomer, and preferably 15–20 percent by weight. For example, a polymerizable coating for a p-type semiconductor may be 18% nucleophilic monomer and 82 percent electrophilic monomer, or 11% nucleophilic monomer and 49 percent electrophilic monomer by weight, and the like.

The advantage of using both varieties of "active" monomers is that the physical properties are greatly enhanced, the coating displaying reduced rigidity and greater resistance to cracking. Interestingly, the use of the electrophilic monomer in connection with the p-type semiconductor coating does not degrade the enhancement of the electrical characteristics of the semiconductor device. In fact, while higher proportions of the nucleophilic monomer may be utilized, the activity of the nucleophilic monomers is so much higher for the purpose of this invention than the activity of the electrophilic monomers, that only a relatively low proportion of nucleophilic monomer to electrophilic monomer is required. Insofar as the nucleophilic monomers tend to be substantially more expensive than the electrophilic monomers, the proportion of nucleophilic monomer to electrophilic monomer is generally maintained at a relatively low level just sufficient to insure that the desired enhancement of electrical properties is obtained. It is noted that the substitution of an electrically neutral monomer or a polymerizable filler for the electrophilic monomer in such polymerizable coatings may provide a p-type coating of acceptable physical characteristics, but the electrical characteristics thereof are not enhanced to the desired level. Thus, in order to obtain both desirable physical characteristics and still obtain enhanced electrical characteristics, one must resort to the expedient of using a polymerizable coating containing both varieties of "active" monomers. The somewhat startling nature of this conclusion is recognized, and no theoretical explanation therefor is ventured. It is theorized that appropriate nucleophilic monomers may be selected which will provide both satisfactory physical characteristics for the coating and the desired enhancement of electrical characteristics without the joint use of electrophilic monomers.

OTHER INGREDIENTS

While the coatings consisting essentially of the electrically active monomers are typically polymerizable at temperatures below 200°C, it has been found that the cure rate for the coating may be substantially increased at lower temperatures through the introduction of a copolymerizable vinyl aromatic monomer into the polymerizable coating composition. The addition of mono- and poly-functional vinyl aromatic monomers such as styrene, vinyl toluene, vinyl benzyl chloride, divinyl benzene and mixtures thereof enable cure of the coating in about 2 to 4 hours at temperatures from about 80° to 165°C, preferably an initial cure for 1-2 hours at 95°–110°C followed by a final cure for 1-2 hours at 125°–150°C. The vinyl aromatic monomer is used in amounts constituting about 10–40 percent by weight of the total coating (excluding filler), and preferably 15–25 percent. The addition of such vinyl aromatic monomers in the specified amounts furthermore desirably increases the structural rigidity of the cured coating without leading to cracking. The use of relatively volatile vinyl aromatic monomers such as styrene at the higher levels may in certain instances lead to excessive shrinkage of the coating during cure (with possible cracking) and a degree of heat-instability in the cured product. Accordingly, less volatile vinyl aromatic monomers such as vinyl toluene should be utilized, despite their higher costs, in situations requiring a higher level of heat-stability. Polyfunctional vinyl aromatic monomers such as divinyl benzene may be utilized despite their volatile nature in situations requiring especially rigid coatings as they tend to increase the degree of cross-linking within the coating.

It has been found that the cured coating may be rendered flame-resistant (i.e., self-extinguishing) by the introduction of a polyfunctional phosphorus monomer into the polymerizable coating composition. In particular the use of the monomers such as bis ($\beta$ - chloroethyl) vinyl phosphonate, bis (ethyl) vinyl phosphonate, triallyl phosphate and mixtures thereof render the cured coating self-extinguishing after ignition. The monomer is used in amounts of about 15–25 percent by weight of the total coating (excluding filler), and preferably 20–25 percent. It should be noted that these monomers are utilizable only in coatings for n-type semiconductor devices as their use in coatings for p-type semiconductive devices will interfere with the enhancement of the electrical properties of the p-type devices.

Especially when the polymerizable coatings are to be applied in a thickness in excess of 0.25 centimeter, it has been found useful to incorporate therein an inexpensive filler to provide both bulk and increased viscosity for the polymerizable coating. Inorganic fillers such as aluminum silicate and organic fillers such as monomers and polymers of cyclohexyl methacrylate (CHMA) may be utilized alone or in combination, although the inorganic fillers are generally preferred for their availability and inexpensiveness as a means of regulating the viscosity of the polymerizable composition so that it may be easily worked and shaped. The fillers generally constitute from about 30 to about 50 percent by weight of the coating (based on the other ingredients thereof), and preferably 35-45 percent.

On the other hand, when the polymerizable coating is to be applied in a thickness of 0.25 centimeter and less, it has been found useful to incorporate therein small amounts of conventional organic solvents such as acetone, cellusolve acetate and methyl ethyl ketone to facilitate application of the polymerizable coating composition uniformly over the surfaces to be passivated. The solvents are generally utilized in amounts from about 30 to 70 percent of the polymerizable composition (excluding the filler). When the amount of solvent is increased above the 70 percent limit, pinhole formation may reappear with a resultant loss of the moisture-resistant properties of the coating.

In order to render the cured coating substantially opaque and light-stable, it is desirable to include therein from about 0.5 to 1.5 percent by weight of carbon black, based on the coating without filler. The use of carbon black within the recommended ranges has been tested in connection with coating compositions for n-type semiconductive devices and been found not to interfere with the desirable electrical characteristics imparted by the cured coating.

The polymerizable coating further contains a conventional polymerization initiator such as the heat-sensitive free radical precursors benzylperoxide (BPO), tert-butyl hydroperoxide (BHPO) and tert-butyl perbenzoate (BPB). Where the polymerizable coating composition is to be stored for a prolonged period as a stock solution, a conventional polymerization inhibitor such as hydroquinone or p-tert-butyl catechol may be incorporated in the polymerizable coating. Such inhibitors also serve to control the rate of the exothermic reactions during curing and thereby minimize cracking of the coatings. The polymerization initiators are used in amounts from about 0.5 to 3.0 percent by weight of the coating (excluding filler), and preferably 1.5 to 2.5%; the polymerization inhibitors are used in amounts from about 0.01 to 0.02% by weight of the coating (excluding filler), and preferably 0.010–0.014 percent.

To summarize, the polymerizable coating for an n-type semiconductor comprises at least 50 percent electrophilic diallyl ester and 0.5-3 percent of a free radical polymerization initiator and, optionally, 15-25 percent polyfunctional vinyl phosphorous monomer, 0.5-1.5 percent carbon black, 10-40 percent vinyl aromatic monomer and 0.01-0.02 percent polymerization inhibitor. Preferably at least 60 percent of the electrophilic diallyl ester and 1.5-2.5% initiator are used, and one or more of the optional ingredients are present in the following amounts: 20-25 percent vinyl phosphonate compound, 0.5-1.5 percent carbon black, 15-25 percent vinyl aromatic monomer, and 0.010-0.014 percent inhibitor. For a p-type semiconductor device, the polymerizable coating comprises 10-25 percent nucleophilic nitrogen-containing vinyl ester and 0.5-3 percent free radical polymerization initiator (preferably also sufficient electrophilic dially ester to make a total of at least 50 percent "active" monomers), and, optionally, 0.5-1.5 percent carbon black, 10-40 percent vinyl aromatic monomer, and 0.01-0.02 percent polymerization inhibitor. Preferably 15-20 percent nucleophilic vinyl ester (generally with sufficient electrophilic diallyl ester to make a total of at least 60 percent active monomers) and 1.5-2.5 percent initiator are used, and one or more of the optional ingredients are present in the following amounts: 0.5-1.5 percent carbon black, 15.-25 percent vinyl aromatic monomer, and 0.010-0.014 percent inhibitor. The polymerizable coatings for both the n-type and p-type semiconductor devices may additionally include 30-50 percent filler, and preferably 35-45 percent inorganic filler. (All percentages given above are weight percentages based on the weight of the polymerizable coating absent any filler.)

APPLICATION OF THE COATING

The coating is applied to the semiconductor surface by conventional techniques such as dipping or molding operations, the former being preferred where thin coatings (about 0.25 cm and less) are to be applied to wafer-like devices, and the latter being preferred for the encapsulation of chip-like devices with thicker coatings (greater than 0.25 cm). Curing of the polymerizable coating is accomplished by introducing free radicals into the polymerizable coating and maintaining the coating at a temperature of about 80°–200°C for a period of time of about 2 to 4 hours sufficient to effect curing (including grafting). The cure temperature and time utilized will be a function of the monomer compounds utilized, the heat-sensitive free radical precursor (or initiator) and similar factors familiar to those skilled in the art. In particular, benzoylperoxide is useful for curing at lower temperatures (80°–100°C) while tertiary butyl perbenzoate is useful at higher temperatures (110°–160°C); a combination of initiators is preferred where free radical generation over a broad range of temperatures is desired. In this case, a low temperature initial cure for 1-2 hours at 95°–110°C is followed by a high temperature final cure for 1–2 hours at 125°–150°C.

To improve the working characteristics and manageability of the polymerizable coating, the electrically active monomers are preferably present both as the monomer and as the prepolymer or partially polymerized compound. In this instance the ratio of monomer to prepolymer is from about 30:70 to 70:30, and preferably about 50:50 by weight.

THEORY

While the reaction mechanisms involved in the process of the present invention are not completely understood, proposed reaction mechanisms are described below. It will be recognized that the present invention is not limited to the proposed reaction mechanisms and, in fact, others may be occurring concurrently with or instead of the proposed reaction mechanisms. Silicon and the other materials commonly found on the surface to be passivated invariably contain exposed hydroxy groups capable of reacting with the electrically active monomer, which for the purpose of this exposition will be assumed to be a diallyl phthalate. These hydroxy groups may either enter into transesterification through the ester or free radical carboxyl groups present in the monomer, or, in the presence of free radicals, undergo oxidation to a hydroperoxy state which subsequently decomposes at elevated temperatures to form an activated oxygen attached to the surface and available for direct reaction with the allyl group of the monomer. Thus, in the case of transesterification, the diallyl monomer is bound to the surface directly through a carboxyl group with the other allyl group being available for chain development; in the case of the free radical catalyzed addition, one allyl group of the diallyl monomer is bonded to the surface through the activated surface oxygen, with the other allyl group being available for chain growth. In both cases, subsequent to attachment of the monomer to the semiconductor surface, chain growth and cross-linking occur in the presence of free radicals and elevated temperatures. It is the intimate grafting of the coating to the surface which not only insures adherence, but enables the coating to modify the electrical characteristics of the device.

The monomers active in providing the improved electrical properties of the coatings are distinguished by their electrical activity-- that is, by their electron donating or accepting quality. The function of the nucleophilic and/or electrophilic compounds grafted to the semiconductor device surface is to preclude the formation of, or electrically neutralize, an accumulation or inversion layer on the semiconductive surface. By thus eliminating the surface layer of low resistivity, leakage is avoided and the breakdown voltage is increased. Thus it is the grafting of electrically active monomers onto the semiconductor surface (as opposed to the prior art applications of electrically neutral materials) which minimizes the formation of, or electrically neutralizes, both inversion and accumulation layers capable of affecting the operation of both "N" and "P" base rectifying structures. The intimately grafted electrically active monomers preclude or minimize the migration of charges along a surface layer of low resistance under reverse bias, such migration under ungrafted conditions resulting in a continuous degradation of the device. As a result, the passivated semiconductive device exhibits primary grading (that is, a sharp switch-over from non-flow to full-flow current) as well as an elevated breakdown or avalanche voltage. For example, an uncoated wafer exhibited a breakdown voltage of 200 volts while a similar wafer having a 0.13 centimeter coating according to the present invention exhibited a breakdown voltage of 1000 volts. Thus the coated semiconductor devices of the present invention display a higher break point in the voltage-current curve and a sharper, clearer break point. The same principles apply, of course, to thyristors and triacs (4 and 5 layer structures) and the like as well as to transistors of both PNP and NPN structure.

EXAMPLES

Illustrative of the efficacy of the present invention are the following examples in which all parts and percentages are by weight unless otherwise indicated.

In the tables, the following legend is used:

| | |
|---|---|
| ACCEPTABLE | OK |
| GOOD | G |
| VERY GOOD | VG |
| EXCELLENT | EX |

GENERALIZED PROCEDURE

The electrically active monomer and any prepolymer are placed in a beaker maintained in a 60°C water bath. The beaker is stirred from time to time until the prepolymer is largely dissolved, at which point the vinyl aromatic monomer, initiator, and other ingredients (other than any organic polymerized filler) are added to the beaker with agitation until complete solution of the initiator is effected and a relatively homogeneous solution obtained. This stock solution is now ready for use, although it is stable for about 2 weeks at room temperature in the absence of a polymerization inhibitor and for a period of months if a polymerization inhibitor is present.

When a polymerized organic filler such as poly (cyclo hexyl methacrylate) is utilized, it is prepared by bulk polymerization of the filler monomer with a small amount of a free radical precursor being dissolved in the filler monomer. Typically about 0.5 percent by weight of benzoyl peroxide is used, based on the weight of the filler monomer. The mixture is polymerized at 80°C for 2-3 hours, followed by a bake at 110°C for 1 hour. After cooling the filler polymer is broken into small pieces which are then further reduced in size using successively a waring blender and then a mortar and pestle. The organic filler is added to the stock solution in predetermined quantities just prior to use.

After application on the surface of the electronic device, the coating is cured at a specified temperature for a specified period of time and tested for various electrical and physical properties.

EXAMPLE I:N-TYPE COATINGS

Coatings 1–3 were applied to General Instrument Corporation RM 18D semiconductor devices composed of a stack of 18 diffused n-type silicon chips connected in series. The leakage current of the coated semiconductor devices was tested under a variety of conditions including high voltages at low temperatures (18 kilovolts at −30°C) and low voltages at high temperatures (1.7 kilovolts at 150°C). In both cases the leakage current as measured by peak inverse voltage and inverse resistance were acceptable. The tests were continued over a period of 300 hours, and it was found that the amount of leakage current did not vary over time by more than 10%, thus indicating a satisfactory run life.

Coatings 4-10 were applied to n-type single chip silicon rectifiers. The rectifiers with coatings 4–5 and 9 were tested at low and high temperatures (room temperature to 150°C) with good to excellent results. The electrical characteristics of the rectifiers with coatings 66-8 and 10 were tested for electrical characteristics at both high and low temperatures, primary grading (the sharpness of the "knee"), thermal stability (the display of constant electrical characteristics over a variety of temperatures) and the tendency to crack. The electrical characteristics ranged from good to excellent, the grading was primary (not more than 0.8 uA leakage at 1000 volts at room temperature), the thermal stability was good to very good, and there was little if any, tendency to crack.

Coatings 11–15 were prepared by mixing at room temperature. Coatings 11–14were applied to n-type silicon wafers having an untreated avalanche voltage of about 200 volts. The application of 0.13–0.15 centimeter films to the wafers increased the breakdown voltages to over 1000 volts.

Coatings 13 and 14 were also applied to n-type nine chip silicon rectifiers, and the coated rectifiers tested for electrical characteristics over a broad operating temperature range. Coating 13 was found to be inert to etchants such as 60 percent hydrochloric acid, concentrated nitric acid, acetic acid, and a mixture of the acids.

Coating 15 was applied to an n-type one chip silicon rectifier, and the coated rectifier tested for electrical properties over a broad operating temperature range.

Coatings 16-18 were applied to an n-type semiconductor device, and the coated devices tested for electronic properties at high and low temperatures, and also for self-extinguishment.

Coating 19 was applied to an n-type semiconductor device and tested for peak inverse voltage (PIV) at various AC current levels.

The compositions, cure conditions and test results for Coatings 1–19 are set forth in Table I.

EXAMPLE II: P-TYPE COATINGS

Coatings 20-26 were applied to General Instrument Corporation A-4 semiconductor devices composed of a p-type single chip silicon rectifier and cured. The coating devices were then tested for various electrical parameters, with the results indicated in Table II.

EXAMPLE III

A coating for a p-type semiconductor was formulated using the following ingredients:

100 parts N-vinyl carbazole
0.7 parts methyl ethyl ketone peroxide (60%)
0.7 parts BHPO (70%)

The formulation was applied to a p-type semiconductor and cured for one hour at 90°C, followed by an hour

TABLE I

| SAMPLE | 1 | 2 | 3 | N-TYPE 4 | 5 | 6 | 7 | 8 | 9 | 10 |
|---|---|---|---|---|---|---|---|---|---|---|
| Ingredients/Results | | | | | | | | | | |
| Prepolymerized Polyallyl Ester | | | | | | | | | | |
| P D A I P | 40 | | | 5 | 4 | 4 | 4 | 4 | 4 | 4 |
| P D A M P | | | | | | | | | | |
| P D A A | | 40 | | | | | | | | |
| P D A T H P | | | 40 | | | | | | | |
| Monomeric Polyallyl Ester | | | | | | | | | | |
| D A I P | 100 | | | 10 | 10 | 10 | 10 | 10 | 10 | 10 |
| D A M P | | | | | | | | | | |
| D A A | | 100 | | | | | | | | |
| D A T H P | | | 100 | | | | | | | |
| Vinyl Aromatic Monomer | | | | | | | | | | |
| Styrene | 140 | 140 | 140 | | | | 14 | 14 | 3.5 | 14 |
| Toluene | | | | | | | | | | |
| SAMPLE | 11 | 12 | 13 | 14 | 15 | 16 | 17 | 18 | 19 | |
| Ingredients/Results | | | | | | | | | | |
| Prepolymerized Polyallyl Ester | | | | | | | | | | |
| P D A I P | | | 3 | 1 | 1.5 | 40 | 40 | 40 | 40 | |
| P D A M P | | | | | | | | | | |
| P D A A | | | | | | | | | | |
| P D A T H P | | | | | | | | | | |
| Monomeric Polyallyl Ester | | | | | | | | | | |
| D A I P | 5 | 10 | 12 | 12 | 10 | 60 | 60 | 60 | 60 | |
| D A M P | | | | | | | | | | |
| D A A | | | | | | | | | | |
| D A T H P | | | | | | | | | | |
| Vinyl Aromatic Monomer | | | | | | | | | | |
| Styrene | 10 | 7 | 5 | 2 | | | | | | |
| Toluene | | | | 2 | 4 | | | | | |
| Vinyl Benzene Chloride | | | | | | | | | | |
| Vinyl Phosphorus Monomer | | | | | | | | | | |
| Bis (β-Chloroethyl) Vinyl Phosphonate | | | | | | | 40 | 40 | | |
| Triallyl Phosphate | | | | | | | | | 40 | |
| Initiators, Solvents, Plasticizers, Fillers, etc. | | | | | | | | | | |
| Aluminum Silicate | | | | | | | | 42 | 14 | |
| SAMPLE | 1 | 2 | 3 | 4 | 5 | 6 | 7 | 8 | 9 | 10 |
| Initiators, Solvents, Plasticizers, Fillers, etc. | | | | | | | | | | |
| CHMA Monomer | | | | | | | | | | 14 |
| CHMA Polymer | 100 | 100 | 100 | | | | | | | |
| Methyl Ethyl Ketone | | | | | | | | | | |
| MEK Peroxide (60%) | | | | 0.32 | 0.42 | 0.42 | 0.54 | 0.14 | 0.067 | 0.056 |
| B P O | 5.6 | 5.6 | 5.6 | | | | | 0.2 | 0.196 | 0.8 |
| t-B H P O (70%) | 8 | 8 | 8 | | | | | | | |
| t- B P B | | | | | 2.8 | 4.2 | | 1.4 | 1.4 | |
| n-Octyl n-Decyl Phthalate | | | | | | | | | | |
| Acetone | | | | | | | | | | |
| Cellusolve Acetate | | | | | | | | | | |
| Test Results | | | | | | | | | | |
| Cure | 130°C at 3 Hrs. | same | same | same | same | same | same | same | same | same |
| Electrical Characteristic | OK | OK | OK | EX | EX | EX | VG | EX | G | VG |
| Primary Grading | | | | | | X | X | X | | X |
| Thermal Stability | | | | | | G | VG | VC | | |
| Tendency to Crack | | | | | | NO | BIT | NO | | NO |
| SAMPLE | 11 | 12 | 13 | 14 | 15 | 16 | 17 | 18 | 19 | |
| Initiators, Solvents Plasticizers, Fillers, etc | | | | | | | | | | |
| CHMA Monomer | | | | | | | | | | |
| CHMA Polymer | | | | | | | | | | |
| Methyl Ethyl Ketone | | 23 | 10 | 10 | | | | | | |
| MEK Peroxide (60%) | | 0.1 | | | 0.4 | | | | | |
| B P O | 0.1 | | 0.1 | 0.2 | | | | | | |
| t-B H P O (70%) | | | | | | 1.4 | 1.4 | 1.4 | 1.4 | |
| t- B P B | | | | | | | | | | |
| n-Octyl n-Decyl Phthalate | | | | | | | | | | |
| Acetone 10 | | | | | | | | | | |
| Cellusolve Acetate | 5 | | | | | | | | | |

TABLE I – Continued

| SAMPLE | 1 | 2 | 3 | N-TYPE 4 | 5 | 6 | 7 | 8 | 9 | 10 |
|---|---|---|---|---|---|---|---|---|---|---|
| Test Results | | | | | | | | | | |
| Cure | 150°C at 40 Min. | same | 180°C at 40 Min. | same | same | 130°C at 4 Hrs. | same | same | same | |
| Electrical Characteristic Primary Grading | | | VG | G | VG | VG | VG | EX | | |
| Thermal Stability | | | | | | | | VG | | |
| Tendency to Crack | | | | | | | | | | |
| Breakdown Voltage, V. | 1000 | 1000 | 1000 | 1000 | | | | | | |
| Self-Extinguishing | | | | | | Yes | Yes | Yes | | |
| SAMPLE | 1 | 2 | 3 | 4 | 5 | 6 | 7 | 8 | 9 | 10 |
| PIV at 1 $\mu$a AC,v | | | | | | | | | | 1500 to 1700 |
| PIV at 10 $\mu$a AC,v | | | | | | | | | | 1600 to 1800 |
| SAMPLE | 11 | 12 | 13 | 14 | 15 | 16 | 17 | 18 | 19 | |
| PIV at 1 $\mu$a AC,v | | | | | | | | 1500 to 1700 | 1700 to 2000 | |
| PIV at 10 $\mu$a AC,v | | | | | | | | 1600 to 1800 | 1800 to 2000 | |

TABLE II

| SAMPLE | 20 | P-TYPE 21 | 22 | 23 | 24 | 25 | 26 |
|---|---|---|---|---|---|---|---|
| Ingredients/Results | | | | | | | |
| Prepolymerized Pollyallyl Ester | | | | | | | |
| P D A I P | 50 | | | | | 50 | |
| P D A M P | | 50 | 50 | 50 | 50 | | 50 |
| Monomeric Pollyallyl Ester | | | | | | | |
| D A M P | 40 | | | | | 40 | |
| D A M P | | 40 | 40 | 40 | 40 | | 40 |
| Nitrogen-Containing Compound | | | | | | | |
| Triallyl Cyanurate | 20 | 25 | | | | | 20 |
| Allyl Imidazole | | | | 20 | 20 | | |
| Dimethylaminoethyl Methacrylate | | | 20 | | | | 20 |
| Initiator/Filler | | | | | | | |
| t-BPB | 1 | 1 | 1 | 1 | 1 | | 1 |
| Aluminum Silicate | | | | | 44 | 36 | 36 |
| Test Results | | | | | | | |
| Cure | 130°C at 4 Hrs. | 130°C at 4 Hrs. | 130°C at 4 Hrs. | 130°C at 4 Hrs. | 130°C at 4 Hrs. | 130°C at 4 Hrs. | 130°C at 4 Hrs. |
| Electrical Properties | VG | G | G* | G | VG | | |
| Thermal Stability | VG | G | | | | | |
| PIV at 1 $\mu$a AC,v | | | | | | 900 to 1150 | 800 to 1200 |
| PIV at 30 $\mu$a AC,v | | | | | | 950–1200 | |
| PIV at 30 $\mu$a DC,v | | | | | | 800–1000 | |

*At low temperature only and a half at 140°C. The coated device exhibited good electronic properties and high thermal stability.

EXAMPLE IV

A polymerizable coating for a p-type semiconductor was formulated using the following ingredients:

50 g. prepolymerized triallyl cyanurate
50 g. triallyl cyanurate monomer
1.2 g. methyl ethyl ketone peroxide (60%).

The formulation was applied to a p-type semiconductor and cured for 2 hours at 150°C. The coated device exhibited good electronic properties and very high thermal stability.

Thus it has been seen that the graft coatings of the present invention provide improved electrical and physical characteristics for the substrate semiconductor device. The polymerizable coating composition is inexpensive, homogeneous, easily workable and curable rapidly at low temperatures. The cured coating imparts to the semiconductor device improved breakdown voltage and knee grading electrical characteristics while exhibiting excellent surface adherence, crack-resistance and thermal stability. The cured coating may further impart, as desired, moisture-resistance, etch-resistance, opacity, light stability and, in some cases, non-flammability (self-extinguishment).

Now that the preferred embodiments of the present invention have been described in detail, various modifications and improvements thereon will become immediately apparent to those skilled in the art. Accordingly, the spirit and scope of the present invention is to be considered as defined not by the foregoing disclosure, but only by the appended claims.

We claim:

1. A process for passivating the surface of a semiconductor device and improving the electrical characteristics thereof comprising the steps of a. applying a polymerizable coating containing at least one electrically active monomer to the surface of the semiconductor device to be passivated; and b. polymerizing and curing said polymerizable coating to effect grafting of said electrically active monomer onto said surface, whereby said cured coating passivates said surface and improves the electrical characteristics of said semiconductor device.

2. The process of claim 1 wherein said electrically active monomer is an electrophilic diallyl ester selected from the group consisting of aliphatic, aromatic, homocyclic compounds and mixtures thereof.

3. The process of claim 2 wherein said electrophilic diallyl ester is selected from the group consisting of diallyl phthalate, tetrahydro diallyl phthalate, diallyl sebacate, diallyl adipate, and mixtures thereof.

4. The process of claim 3 wherein electrophilic diallyl ester is a diallyl phthalate selected from the group consisting of di-ortho-diallyl phthalate and a mixture of di-ortho- and di-meta- diallyl phthalate.

5. The process of claim 2 wherein said electrophilic diallyl ester comprises at least 60 percent by weight of said polymerizable coating absent any filler.

6. The process of claim 2 wherein said semiconductor is an n-type semiconductor, and wherein said polymerizable coating further includes about 15-25 percent of polyfunctional vinyl phosphorus monomer, based on the weight of said polymerizable coating absent any filler, whereby said cured coating is flame-resistant.

7. The process of claim 6 wherein said phosphorus monomer is selected from the group consisting of bis ($\beta$ - chloroethyl) vinyl phosphonate, bis (ethyl) vinyl phosphonate, triallyl phosphate and mixtures thereof.

8. The process of claim 1 wherein said polymerizable coating further includes about 0.5-1.5 percent of carbon black, based on the weight of said polymerizable coating absent any filler, whereby said cured coating is substantially opaque and light-stable.

9. The process of claim 1 wherein said polymerizable coating further includes about 10-40 percent of vinyl aromatic monomer, based on the weight of said polymerizable coating absent any filler, whereby curing of said polymerizable coating is facilitated and the rigidity of said cured coating is increased.

10. The process of claim 9 wherein said vinyl aromatic monomer is selected from the group consisting of styrene, vinyl toluene, vinyl benzyl chloride, divinyl benzene, and mixtures thereof, and wherein said polymerizable compound is cured at about 80°–120°C.

11. The process of claim 1 wherein said polymerizable coating further includes about 30-50 percent of filler, based on the weight of said polymerizable coating absent any filler, whereby the viscosity of said polymerizable coating is increased.

12. The process of claim 11 wherein said filler is aluminum silicate.

13. The process of claim 1 wherein free radicals are introduced into said polymerizable coating after said application and said polymerizable coating is maintained at a temperature of about 80° to 200°C for a period of time sufficient to effect said grafting and cure.

14. The process of claim 1 wherein said polymerizable coating comprises a mixture of the monomer and prepolymer of said at least one electrically active monomer.

15. The process of claim 14 wherein the ratio of said monomer to said prepolymer is about 30:70 to 70:30.

16. The process of claim 1 wherein said electrically active monomer is a nucleophilic nitrogen-containing vinyl ester.

17. The process of claim 1 wherein said polymerizable coating contains at least one electrophilic monomer and at least one nucleophilic monomer.

18. The process of claim 17 wherein both said electrophilic monomer and said nucleophilic monomer contain a plurality of allyl groups.

19. The process of claim 17 wherein said semiconductor device is a p-type semiconductor and said polymerizable coating comprises at least 60 percent of electrically active monomers including 15-20 percent of at least one nucleophilic nitrogen-containing vinyl ester monomer, based on the weight of said polymerizable coating absent any filler.

20. The process of claim 19 wherein said nucleophilic vinyl ester monomer contains a ring-nitrogen.

21. The process of claim 20 wherein said nucleophilic vinyl ester monomer is a polyallyl cyanidine.

22. The process of claim 20 wherein said nucleophilic vinyl ester monomer is selected from the group consisting of triallyl cyanurate, allyl imidazole, vinyl carbazole, diallyl melamine and mixtures thereof.

23. The process of claim 1 wherein said surface has exposed hydroxyl groups thereon available for reaction with said electrically active monomer, and at least some of said electrically active monomer undergoes transesterification with at least some of said hydroxyl groups during said polymerization and curing.

24. The process of claim 1 wherein said surface is comprises at least in part of material selected from the group consisting of silicon, the oxides thereof, the hydroxides thereof, and combinations thereof.

25. The process of claim 1 wherein said semiconductor is an n-type semiconductor, and wherein said polymerizable coating comprises I. at least 50 percent electrophilic diallyl ester, II. 20-25 percent polyfunctional vinyl phosphorus compound, and, III. 15-25 percent vinyl aromatic monomer, based on the weight of said polymerizable coating absent any filler.

26. The process of claim 25 wherein said polymerizable coating additionally contains 30–50 percent inorganic filler.

27. The process of claim 1 wherein said semiconductor is a p-type semiconductor, and wherein said polymerizable coating comprises I. at least 60 percent electrically active monomers including 15-20 percent nucleophilic nitrogen-containing vinyl ester, and II. 15-25 percent vinyl aromatic monomer, based on the weight of said polymerizable coating absent any filler.

28. The process of claim 27 wherein said polymerizable coating additionally contains 30–50 percent inorganic filler.

29. In a semiconductor device having a surface and a passivating coating on said surface, the improvement wherein said coating contains at least one polymerized and cured electrically active monomer grafted onto said surface to improve the electrical characteristics of said semiconductor device.

30. The semiconductor device of claim 29 wherein said electrically active monomer is an electrophilic diallyl ester selected from the group consisting of aliphatic, aromatic, homocyclic compounds and mixtures thereof.

31. The semiconductor device of claim 30 wherein said electrophilic diallyl ester is selected from the group consistinng of diallyl phthalate, tetrahydro diallyl phthalate, diallyl sebacate, diallyl adepate, and mixtures thereof.

32. The semiconductor device of claim 31 wherein said electrophilic diallyl ester is a dially phthalate selected from the group consisting of di-ortho-diallyl phthalate and a mixture of di-ortho- and di-meta-diallyl phthalate.

33. The semiconductor device of claim 32 wherein said electrophilic diallyl ester is at least 60% by weight of said coating absent any filler.

34. The semiconductor device of claim 30 wherein said semiconductor is an n-type semiconductor, and wherein said coating further includes about 15-25 percent of copolymerized polyfunctional vinyl phosphorus monomer, based on the weight of said coating absent any filler, whereby said coating is flame-resistant.

35. The semiconductor device of claim 34 wherein said phosphorus monomer is selected from the group consisting of bis ( $\beta$ - chloroethyl) vinyl phosphonate, bis (ethyl) vinyl phosphonate, triallyl phosphate and mixtures thereof.

36. The semiconductor device of claim 29 wherein said coating further includes about 0.5-1.5 percent of carbon black, based on the weight of said coating absent any filler, whereby said coating is substantially opaque and light-stable.

37. The semiconductor device of claim 29 wherein said coating further includes about 10-40 percent of copolymerized vinyl aromatic monomer, based on the weight of said coating absent any filler, whereby the rigidity of said coating is increased.

38. The semiconductor device of claim 37 wherein said vinyl aromatic monomer is selected from the group consisting of styrene, vinyl toluene, vinyl benzyl chloride, divinyl benzene, and mixtures thereof.

39. The semiconductor device of claim 29 wherein said coating further includes about 30-50 percent of filler, based on the weight of said coating absent any filler.

40. The semiconductor device of claim 39 wherein said inorganic filler is aluminum silicate.

41. The semiconductor device of claim 29 wherein said electrically active monomer is a nucleophilic nitrogen-containing vinyl ester.

42. The semiconductor device of claim 29 wherein said coating contains at least one copolymerized and cured electrophilic monomer and at least one copolymerized and cured nucleophilic monomer.

43. The semiconductor device of claim 42 wherein both said electrophilic monomer and said nucleophilic monomer contain a plurality of allyl groups.

44. The semiconductor device of claim 29 wherein said semiconductor device is a p-type semiconductor and said coating comprises at least 60% of copolymerized and cured electrically active monomers including at least 15-20 percent of copolymerized nucleophilic nitrogen-containing vinyl ester monomer, based on the weight of said coating absent any filler.

45. The semiconductor device of claim 44 wherein said nucleophilic vinyl ester monomer contains a ring-nitrogen.

46. The semiconductor device of claim 45 wherein said nucleophilic vinyl ester monomer is a polyallyl cyanidine.

47. The semiconductor device of claim 45 wherein said nucleophilic vinyl ester monomer is selected from the group of triallyl cyanurate, allyl imidazole, vinyl carbazole, diallyl melamine and mixtures thereof.

48. The semiconductor device of claim 47 wherein said coating further includes about 30-50 percent of filler, based on the weight of said coating absent any filler.

49. The semiconductor device of claim 29 wherein said surface is comprised at least in part of material selected from the group consisting of silicon, the oxides thereof, the hydroxides thereof, and combinations thereof.

50. The semiconductor device of claim 29 wherein said semiconductor is an n-type semiconductor, and wherein said coating comprises the reaction product of I. at least 50% electrophilic diallyl ester, II. 20-25 percent polyfunctional vinyl phosphorus compound, and III. 15-25 percent vinyl aromatic monomer, based on the weight of said coating absent any filler.

51. The semiconductor device of claim 50 wherein said coating additionally contains 30–50 percent inorganic filler.

52. The semiconductor device of claim 29 wherein said semiconductor is a p-type semiconductor, and wherein said coating comprises the reaction product of I. at least 60 percent electrically active monomers, including 15-20 percent nucleophilic nitrogen-containing vinyl ester, and II. 15-25 percent vinyl aromatic monomer, based on the weight of said coating absent any filler.

53. The semiconductor device of claim 52 wherein said coating additionally contains 30–50 percent inorganic filler.

54. The process of claim 1 wherein said electrically active monomer is selected from the group consisting of electrophilic polyallyl esters and nucleophilic nitrogen-containing vinyl esters.

55. The process of claim 54 wherein said polymerizable coating for application to an n-type semiconductor includes at least 50% by weight of said electrophilic polyallyl esters and said polymerizable coating for application to a p-type semiconductor includes 10-25 percent by weight of said nucleophilic nitrogen-containing vinyl esters, said percentages ebing based on the weight of said polymerizable coating, absent any filler.

56. The semiconductor device of claim 29 wherein siad electrically active monomer is selected from the group consisting of electrophilic polyallyl esters and nucleophilic nitrogen-containing vinyl esters.

57. The semiconductor device of claim 56 wherein said coating on an n-type semiconductor includes at least 50% by weight of said electrophilic polyallyl esters, and said coating on a p-type semiconductor includes 10–25 percent by weight of said nucleophilic nitrogen-containing vinyl esters, said percentages being based on the weight of said coating, absent any filler.

* * * * *